US011942951B2

(12) United States Patent
Anstett, III et al.

(10) Patent No.: US 11,942,951 B2
(45) Date of Patent: Mar. 26, 2024

(54) CONDITIONAL TRACK AND HOLD AMPLIFIER

(71) Applicant: Dwellwell Analytics, Inc., Bethesda, MD (US)

(72) Inventors: Joseph E. Anstett, III, Raleigh, NC (US); Cynthia E. Cantrell, Hagerstown, MD (US)

(73) Assignee: Dwellwell Analytics, Inc., Bethesda, MD (US)

(*) Notice: Subject to any disclaimer, the term of this patent is extended or adjusted under 35 U.S.C. 154(b) by 0 days.

(21) Appl. No.: 17/588,841

(22) Filed: Jan. 31, 2022

(65) Prior Publication Data

US 2023/0246638 A1 Aug. 3, 2023

(51) Int. Cl.
*H03K 5/24* (2006.01)
*G05F 1/56* (2006.01)
*H03K 5/02* (2006.01)

(52) U.S. Cl.
CPC ............ *H03K 5/24* (2013.01); *G05F 1/56* (2013.01); *H03K 5/02* (2013.01)

(58) Field of Classification Search
CPC ............ H03K 5/1532; H03K 5/08; H03K 5/084–086; G01R 19/04; G11C 27/02–028
See application file for complete search history.

(56) References Cited

U.S. PATENT DOCUMENTS

| 4,086,651 | A | * | 4/1978 | Muir | H03K 5/1532 327/91 |
| 4,263,653 | A | * | 4/1981 | Mecklenburg | G01R 27/06 324/95 |
| 4,335,301 | A | * | 6/1982 | Palmer | G06K 7/10851 327/184 |
| 4,459,699 | A | * | 7/1984 | Monticelli | H04L 27/142 327/100 |
| 4,686,389 | A | * | 8/1987 | Seifert | G11C 27/026 327/91 |
| 4,803,382 | A | * | 2/1989 | Tanimoto | H04L 25/0278 327/63 |
| 5,003,523 | A | * | 3/1991 | Wachi | G11B 7/08511 |

(Continued)

OTHER PUBLICATIONS

International Search Report and Written Opinion for PCT/US2023/011635 dated Mar. 8, 2023 ( 9 pages).

(Continued)

*Primary Examiner* — Thomas J. Hiltunen
(74) *Attorney, Agent, or Firm* — Klintworth & Rozenblat IP LLP (57) ABSTRACT

Example embodiments include an apparatus with a buffer amplifier having an output node. A first switchable unidirectional current path is provided between the output node and a capacitor, the first path allowing current flow from the capacitor to the output node. A second switchable unidirectional current path is provided between the output node and the capacitor, the second path allowing current flow from the output node to the capacitor. Comparator circuitry is provided that operates to open the first path if the capacitor voltage is above an upper threshold and to open the second path if the capacitor voltage is below a lower threshold. The capacitor voltage may be read by an analog-to-digital converter.

19 Claims, 5 Drawing Sheets

(56) References Cited

U.S. PATENT DOCUMENTS

| | | | | |
|---|---|---|---|---|
| 5,377,054 | A | * | 12/1994 | Yamaguchi ...... G11B 20/10009 360/59 |
| 5,412,692 | A | * | 5/1995 | Uchida ................ H04L 25/062 375/317 |
| 5,493,219 | A | * | 2/1996 | Makino .............. G01D 5/24476 324/207.25 |
| 7,505,600 | B2 | * | 3/2009 | Dryer ...................... G08B 3/10 381/116 |
| 7,518,414 | B2 | * | 4/2009 | Romero .............. H03K 5/1532 327/96 |
| 8,064,779 | B2 | * | 11/2011 | Tsunoda ................. H04L 27/08 398/208 |
| 8,996,190 | B2 | * | 3/2015 | Williams .............. H05B 47/14 700/295 |
| 9,362,756 | B2 | * | 6/2016 | Khandelwal ......... H04B 5/0093 |
| 9,614,517 | B2 | * | 4/2017 | Krishna .............. H03K 17/165 |
| 9,755,421 | B2 | * | 9/2017 | Chang ................. H02H 7/1213 |

OTHER PUBLICATIONS

"Activity: Track-and-Hold Amplifier," Jan. 29, 2021, retrieved from https://wiki.analog.com/university/courses/alm1k/alm-signals-labs/alm-tha-lab (12 pages).

Analog Devices, Inc. "Sample-and-Hold Amplifiers" 2009, retrieved from https://www.analog.com/media/cn/training-seminars/tutorials/MT-090.pdf (21 pages).

* cited by examiner

CONDITIONAL TRACK AND HOLD AMPLIFIER

BACKGROUND

The present disclosure relates to voltage measurement, such as the measurement of signal transients at an alternating current (AC) power outlet.

In the United States, a household AC power outlet typically provides a nominal 60 Hz sine wave. In some other countries, an AC power outlet provides a nominal 50 Hz sine wave. Occasionally, transients can appear superimposed on the nominal signal. Such transients can be caused by, among other reasons, electrical appliances that are in use or are being turned on or off in the household.

It can be desirable to be able to monitor the presence and characteristics of those transients to detect the presence of potential problems or other events of interest in the domestic electrical circuitry. However, transients by their nature can occur over a very short timeframe and thus can be difficult to monitor and characterize. Constant monitoring of the supply voltage waveform would generate an inordinate amount of data, much of which would be of little value under normal conditions. It would also be possible to divide the voltage signal into multiple channels, such as one channel representing the root mean square (RMS) of the signal and another channel representing a transient signal peak. However, it would be desirable to avoid the additional resources (e.g. two analog-to-digital converters) used in such a two-channel system.

SUMMARY

An apparatus according to some embodiments includes a buffer amplifier having an output node; a first switchable unidirectional current path between the output node and a capacitor, the first unidirectional current path selectively allowing current flow from the capacitor to the output node; and comparator circuitry operative, in response to a voltage on the capacitor being above an upper threshold, to open the first switchable unidirectional current path.

In some embodiments, the apparatus further includes a second switchable unidirectional current path between the output node and the capacitor, the second unidirectional current path selectively allowing current flow from the output node to the capacitor. In such an embodiment, the comparator circuitry is further operative, in response to the voltage on the capacitor being below a lower threshold, to open the second switchable unidirectional current path.

In some embodiments, the apparatus further includes an analog-to-digital converter configured to sample (directly or indirectly, e.g. through a filter and/or buffer) the voltage on the hold capacitor.

In some embodiments, the apparatus further includes a low-pass filter between the hold capacitor and the analog-to-digital converter.

In some embodiments, the apparatus further includes a filter, such as a frequency-selective filter between the hold capacitor and the comparator circuitry.

In some embodiments, the apparatus further includes an alternating current (AC) power plug coupled to an input node of the buffer amplifier. The power plug may be coupled to the input node though additional circuitry such as a voltage divider, direct current (DC) offset circuitry, and/or other componentry.

An apparatus according to some embodiments includes: a capacitor having a capacitor terminal; a buffer amplifier having an output node; a first current path between the output node and the capacitor terminal, the first current path having, in series, a first switch and a first diode, the first diode being oriented to prevent current flow from the output node to the capacitor terminal; and a second current path between the output node and the capacitor terminal, the second current path having, in series, a second switch and a second diode, the second diode being oriented to prevent current flow from the capacitor terminal to the output.

In some embodiments, the apparatus further includes a first comparator configured to open the first switch in response to a determination that a voltage on the capacitor terminal is above an upper threshold; and a second comparator configured to open the second switch in response to a determination that a voltage on the capacitor terminal is below a lower threshold.

In some embodiments, the first switch is coupled to the first comparator through a first OR gate, the first comparator providing an input to the first OR gate and a first reset terminal providing another input to the first OR gate; and the second switch is coupled to the second comparator through a second OR gate, the second comparator providing an input to the second OR gate and a second reset terminal providing another input to the second OR gate.

In some embodiments, the apparatus further includes an analog-to-digital converter coupled to the terminal.

In some embodiments, the first switch includes a first transistor and the second switch includes a second transistor.

In some embodiments, the first switch is an NPN bipolar junction transistor and the second switch is a PNP bipolar junction transistor.

In some embodiments, the apparatus includes a filter, such as a frequency-selective filter, between (i) the capacitor terminal and (ii) the first and second comparators.

In some embodiments, the apparatus further includes an alternating current (AC) power plug coupled to an input node of the buffer amplifier. The coupling may be an indirect coupling such as a coupling through circuitry configured to downscale, filter, and/or level shift the AC voltage before it reaches the buffer amplifier.

A method according to some embodiments includes: providing a signal to a capacitor; comparing a voltage on the capacitor to an upper threshold voltage, which may be a predetermined upper threshold voltage; in response to a determination that the voltage on the capacitor is greater than the upper threshold voltage, at least temporarily preventing the signal from discharging the capacitor; and reading at least a first voltage from the capacitor.

In some embodiments, the method further includes: comparing the voltage on the capacitor to a lower threshold voltage, which may be a predetermined lower threshold voltage; in response to a determination that the voltage on the capacitor is less than the lower threshold, at least temporarily preventing the signal from charging the capacitor; and reading at least a second voltage from the capacitor.

In some embodiments, reading the first voltage is performed in response to the determination that the voltage on the capacitor is greater than the upper threshold voltage.

In some embodiments, reading the second voltage is performed in response to the determination that the voltage on the capacitor is less than the lower threshold voltage.

In some embodiments, the signal represents a voltage of an alternating current (AC) power supply. The representation of the AC voltage may be, for example, a downscaled, level-shifted, and/or filtered representation of the AC voltage to allow for processing without high-voltage electronics.

In some embodiments, the voltage is read from the capacitor periodically, and wherein the reading of the first and second voltages is performed as a part of the periodic reading of the voltage.

DETAILED DESCRIPTION

Figure 1:
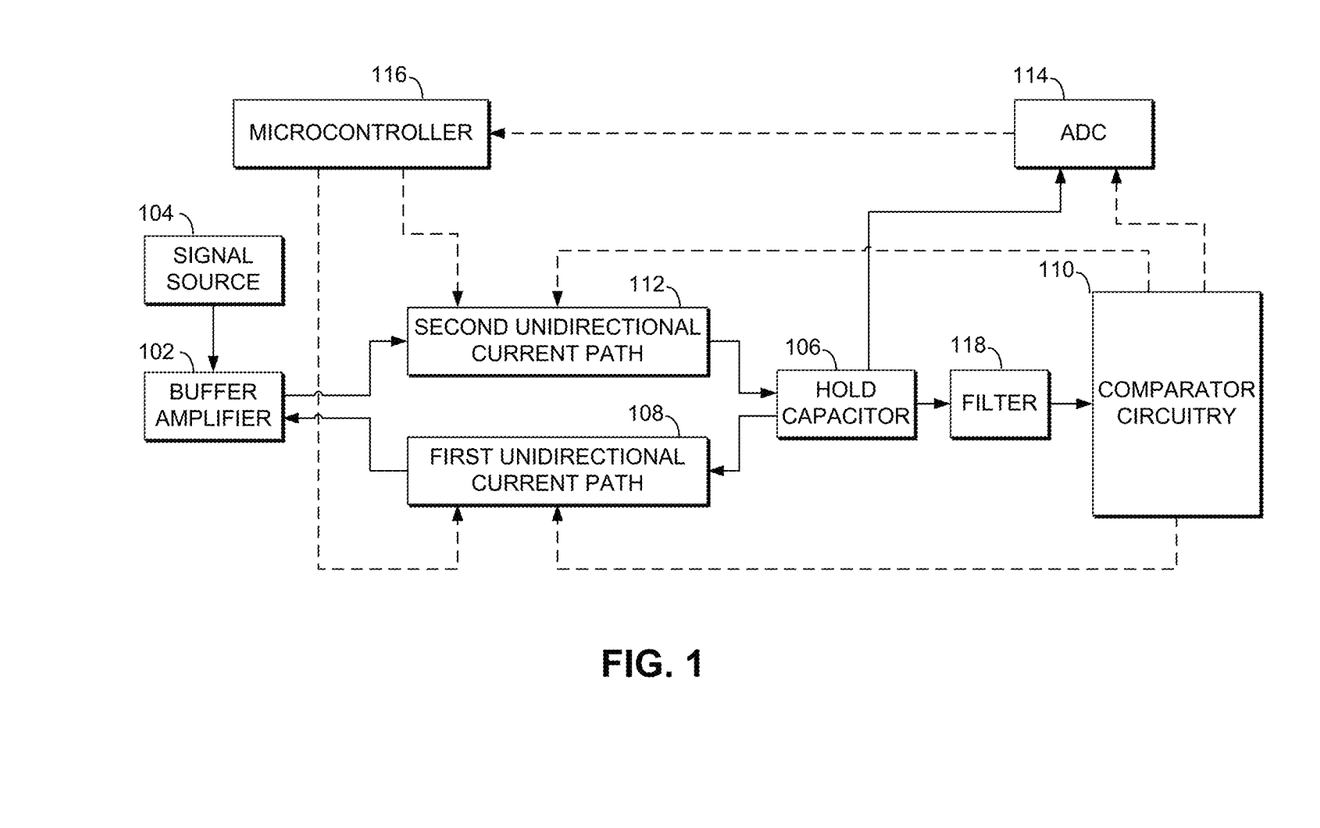
FIG. 1 is a functional block diagram of an apparatus according to some embodiments, which may be implemented using circuitry such as that of FIGS. 3 and 4.

An example of circuitry that may be used in some embodiments to detect signal transients is illustrated in the functional block diagram of FIG. 1. An input node of buffer amplifier 102 is coupled to a signal source 104. In embodiments where the signal source 104 is a household alternating current (AC) power supply, the coupling may be performed using a plug configured to fit a conventional AC power socket. The configuration of the plug and the socket may vary in different countries, and different configurations may be used in different embodiments as appropriate. In general, the signal source 104 is not itself a portion of the embodiments described herein, rather, the circuitry is configured to be releasably couplable to the signal source (e.g. capable of being directly or indirectly attached to or detached from the signal source).

A capacitor 106 is provided, which may be referred to as a hold capacitor. Capacitor 106 may be a single capacitor device, or, in some embodiments, it may include more than one capacitor device configured to perform cooperatively as a hold capacitor.

The buffer amplifier 102 has an output node, and a first switchable unidirectional current path 108 is provided between the capacitor 106 and the first unidirectional current path 108. The first unidirectional current path selectively allows current flow from the capacitor to the output node under conditions described in further detail below.

Comparator circuitry 110 is further provided to operate in response to the voltage on the capacitor 106. In some embodiments, in response to a voltage on the capacitor being above an upper threshold, the comparator circuitry 110 is operative to open the first switchable unidirectional current path to substantially prevent current flow therethrough. In some embodiments, the upper threshold is a predetermined upper voltage threshold $V_{ThU}$.

In some embodiments, a second switchable unidirectional current path 112 is provided between the output node of the buffer amplifier 102 and the capacitor 106. The second unidirectional current path 112 selectively allows current flow from the output node to the capacitor.

In some embodiments, in response to a voltage on the capacitor below a lower threshold, the comparator circuitry 110 is operative to open the second switchable unidirectional current path 112 to substantially prevent current flow therethrough. In some embodiments, the lower threshold is a predetermined lower voltage threshold $V_{ThL}$.

In some embodiments, an analog-to-digital converter (ADC) 114 is coupled directly or indirectly (e.g. through additional buffering and/or filtering circuitry) to the capacitor 106 to sample the voltage on the capacitor 106. In some embodiments, the ADC may be configured to sample the voltage in response to the voltage exceeding the upper threshold and/or falling below the lower threshold, in which case the ADC may be triggered to perform a reading by the comparator circuitry. In some embodiments, the ADC may read the voltage periodically, e.g. with a sampling rate of 120 Hz or any other sampling rate as appropriate to the desired use. The sampling may be performed, for example, at or above the Nyquist rate of the nominal signal as appropriate to the desired use.

In some embodiments, the ADC may provide a digital signal representative of the voltage to a microcontroller 116. In some embodiments, the ADC 114 may be a component of the microcontroller 116.

In some embodiments, after the voltage on the capacitor 106 has been read using the ADC 114, one or more signals from the microcontroller 116 are provided to the first unidirectional current path 108 and/or to the second unidirectional current path 112 to close those current paths to allow current to flow therethrough.

In some embodiments, a filter 118, such as a high-pass filter or other frequency-dependent filter, may be provided between the capacitor 106 and the comparator circuitry 110. In other embodiments, the filter 118 is not included. Some embodiments further include a low-pass filter (not illustrated) between the hold capacitor and the analog-to-digital converter.

Figure 2:
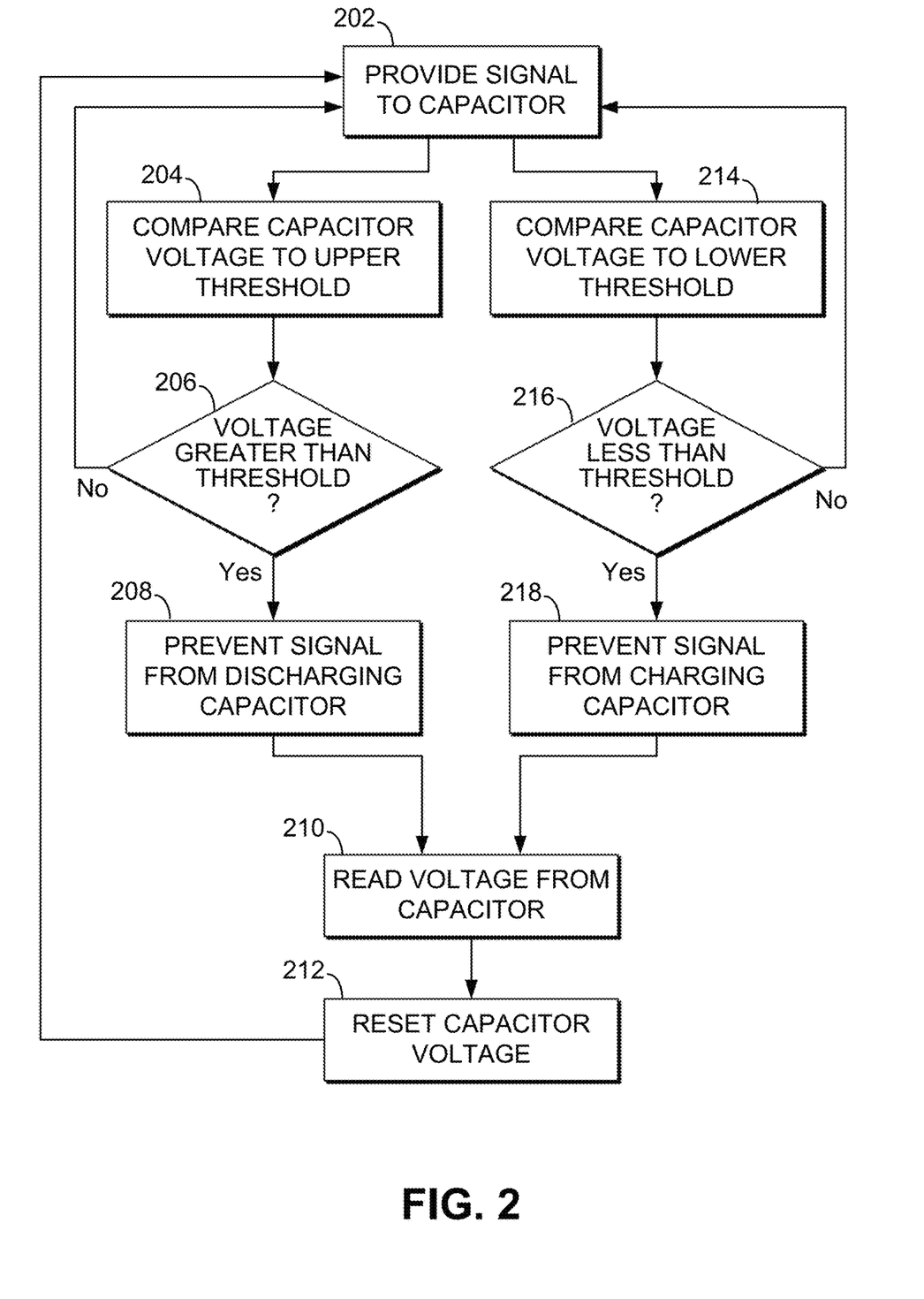
FIG. 2 is a flow diagram of a method performed according to some embodiments.

An example of operation of a system as illustrated in FIG. 1, is illustrated in FIG. 2. A signal is provided (202) to the capacitor. The signal may be provided directly or indirectly through componentry such as a buffer amplifier and/or a voltage divider. A comparison is made (204) between the voltage on the capacitor and an upper threshold voltage. In response to a determination (206) that the voltage on the capacitor is greater than the upper threshold, the signal is at least temporarily prevented (208) from discharging the capacitor, e.g. by opening the first unidirectional current path 108. A first voltage value is read (210) from the capacitor. Subsequently, the capacitor voltage may be reset (212), e.g. by closing the first unidirectional current path 108.

The reading of the voltage may take place between the time the signal is prevented from discharging the capacitor (208) and the time the capacitor voltage is reset (212). For example, this may be between the time the first unidirectional current path 108 is opened and the time the first unidirectional current path 108 is closed. In some embodiments, the reading of the voltage is performed in response to (e.g. triggered by) the voltage exceeding the upper threshold. In other embodiments, the voltage may be sampled periodically including at the time during which the first unidirectional current path 108 is closed.

According to such a method, the voltage on the capacitor generally follows the voltage of the signal as long as the signal is permitted to both charge the capacitor (through the second unidirectional current path) and to discharge the capacitor (through the first unidirectional current path). However, in response to a determination that the signal exceeds the upper threshold, which may indicate a transient, the capacitor is prevented from discharging through the first unidirectional current path, allowing for a stable measurement of the transient to take place before the capacitor is discharged.

In further aspects of a method performed in some embodiments, a comparison is made (214) between the voltage on the capacitor and a lower threshold voltage. In response to a determination (216) that the voltage on the capacitor is less than the lower threshold, the signal is at least temporarily prevented (218) from discharging the capacitor, e.g. by opening the second unidirectional current path 112. A voltage value is read (210) from the capacitor. Subsequently, the capacitor voltage may be reset (212), e.g. by closing the second unidirectional current path 112.

The reading of the voltage may take place between the time the signal is prevented from discharging the capacitor (218) and the time the capacitor voltage is reset (212). For example, this may be between the time the second unidirectional current path 112 is opened and the time the second unidirectional current path 112 is closed. In some embodiments, the reading of the voltage is performed in response to (e.g. triggered by) the voltage falling below the lower threshold. In other embodiments, the voltage may be sampled periodically including at the time during which the first unidirectional current path 112 is closed.

As described above, the voltage on the capacitor generally follows the voltage of the signal as long as the signal is permitted to both charge the capacitor (through the second unidirectional current path) and to discharge the capacitor (through the first unidirectional current path). However, in response to a determination that the signal falls below the lower threshold, which may indicate a transient, the capacitor is prevented from charging through the second unidirectional current path, allowing for a stable measurement of the transient to take place before the capacitor is again charged.

In some embodiments, the signal that is provided (202) to the capacitor is a signal that represents the voltage of an alternating current (AC) power supply. The signal may be provided directly or indirectly through componentry such as a buffer amplifier and/or a voltage divider. In this way, the signal provided to the capacitor may be, for example, scaled down as compared to the relatively high voltage signal of the AC power supply itself. Similarly, the signal provided to the capacitor may be a signal to which a voltage offset has been applied. A voltage offset may be applied, for example, such that the voltage applied to the capacitor is always positive (relative to a ground voltage level) even when the AC power supply voltage (or other signal of interest) is negative.

Figure 3:
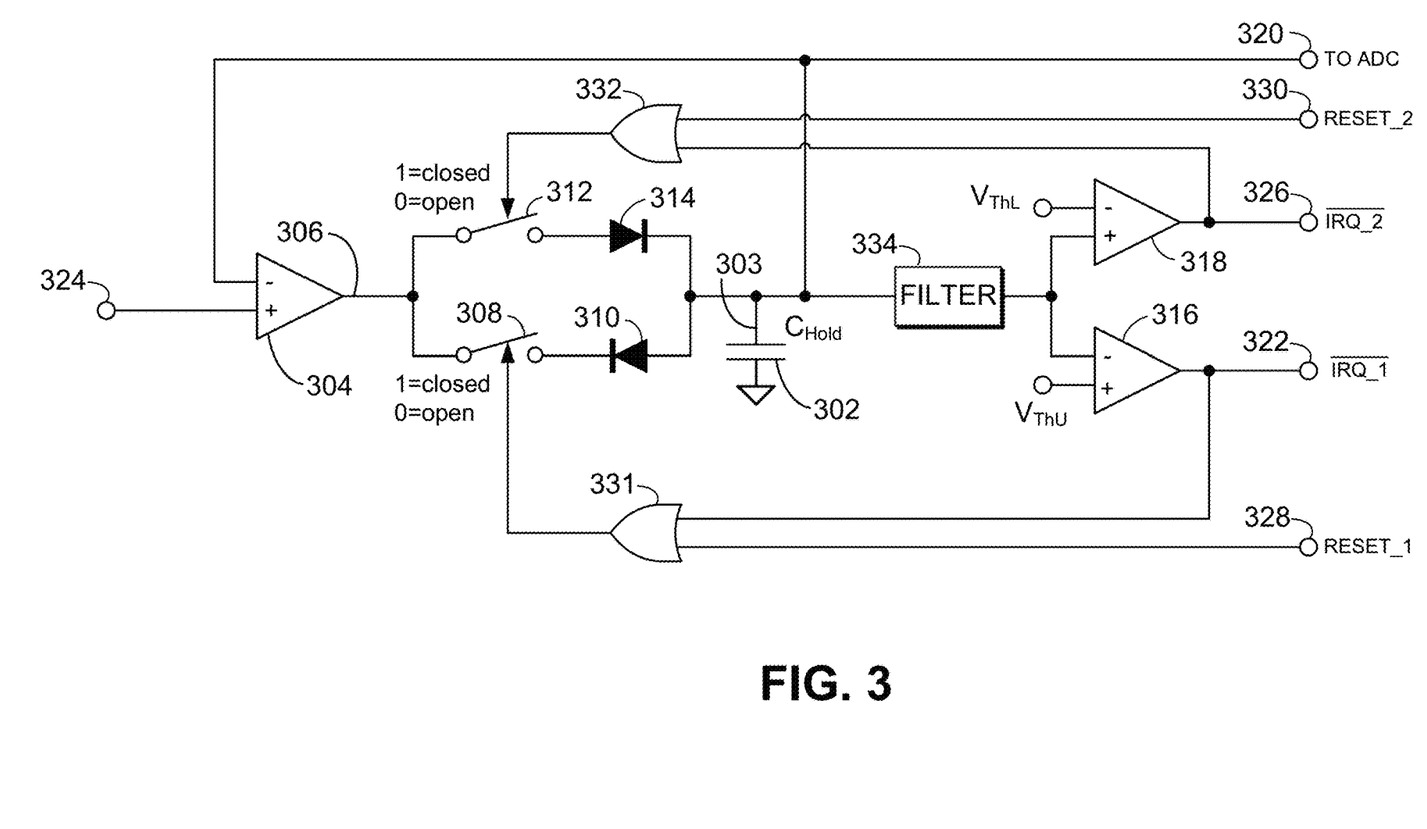
FIG. 3 is a schematic circuit diagram of an apparatus according to some embodiments.

A schematic illustration of a circuit that can be used in some embodiments is provided in FIG. 3. The circuit of FIG. 3 includes a capacitor 302, which may be a hold capacitor with capacitance $C_{Hold}$. The capacitor includes a first capacitor terminal 303. A second terminal of the capacitor may be coupled (directly or indirectly) to ground.

A buffer amplifier 304 is provided. In some embodiments, the buffer has an open-loop DC gain of at least 60 dB. In some embodiments, the buffer has a gain-bandwidth product of at least 8 MHz. In other embodiments, however, the buffer amplifier may have other gain values. The buffer amplifier has an output node 306.

The circuit includes a first current path between the output node 306 and the capacitor terminal 303. The first current path includes, in series, a first switch 308 and a first diode 310. The first diode is oriented to prevent current flow from the output node to the capacitor terminal.

The circuit further includes a second current path between the output node 306 and the capacitor terminal 303. The second current path has, in series, a second switch 312 and a second diode 314, the second diode being oriented to prevent current flow from the capacitor terminal to the output.

Comparator circuity is provided including a first comparator 316 and a second comparator 318. One or more of the comparators may be implemented using an operational amplifier (op amp). The first comparator 316 is configured to open the first switch 308 in response to a determination that a voltage on the capacitor terminal 303 is above an upper threshold $V_{ThU}$. The second comparator 318 is configured to open the second switch 312 in response to a determination that a voltage on the capacitor terminal 303 is below a lower threshold $V_{ThL}$.

In some embodiments, the comparator upper threshold voltage $V_{ThU}$ and the lower threshold voltage $V_{ThL}$ are provided to their respective comparators as reference voltages, which may be generated using, for example, voltage dividers or other techniques.

In the example of FIG. 3, while the voltage on the capacitor terminal 303 is below the upper threshold voltage $V_{ThU}$, the comparator 316 outputs a HIGH (or "1") value that closes the first switch 308. If the voltage on the capacitor terminal 303 goes above the upper threshold voltage $V_{ThU}$, the comparator 316 outputs a LOW (or "0") value that opens the first switch 308 (except under reset conditions, discussed below).

Similarly, while the voltage on the capacitor terminal 303 is above the lower threshold voltage $V_{ThL}$, the comparator 316 outputs a HIGH (or "1") value that closes the second switch 312. If the voltage on the capacitor terminal 303 goes below the lower threshold voltage $V_{ThL}$, the comparator 316 outputs a LOW (or "0") value that opens the second switch 312 (except under reset conditions, discussed below).

A node 320 is provided through which the circuit may be coupled (directly or indirectly to an analog to digital converter, such as ADC 114. In some embodiments, the coupling between node 320 and the ADC is accomplished through either or both of a buffer amplifier and a filter (such as a low-pass filter).

In some embodiments, a node 322 is provided to supply an output (e.g. $\overline{IRQ\_1}$) that may be used to represent the output of the first comparator 316. The output provided at node 322 may be used in some embodiments (e.g. by the microcontroller 116) to trigger the reading by an ADC (e.g. ADC 114) of the voltage at node 320 in response to the voltage exceeding the threshold $V_{ThU}$. The voltage read at node 320 represents a possibly filtered, scaled, offset, and/or buffered version of the voltage on the capacitor terminal 303. In this way, the voltage read at the node 320 may be used characterize a positive transient voltage at an input node (e.g. node 324) without requiring a high sampling rate from the ADC 114 and without imposing high processing requirements on the microcontroller 116.

In some embodiments, a node 326 is provided to supply an output (e.g. $\overline{IRQ\_2}$) that may be used to represent the output of the second comparator 318. The output provided at node 326 may be used in some embodiments (e.g. by the microcontroller 116) to trigger the reading by an ADC (e.g. ADC 114) of the voltage at node 320 in response to the voltage falling below the threshold $V_{ThL}$. In this way, the voltage read at the node 320 may be used characterize a negative transient voltage at an input node (e.g. node 324) without requiring a high sampling rate from the ADC 114 and without imposing high processing requirements on the microcontroller 116.

Some embodiments are configured as shown in FIG. 3 to detect and allow measurement of both positive and negative transient voltages. Other embodiments may be configured to detect and allow measurement only of positive transients or only of negative transients.

In some embodiments, a first reset control node 328 (RESET_1) is provided. The first comparator 316 and the first reset control node 328 are coupled to the first switch 308 through a first OR gate 331. In this way, the first switch 308 is closed not only in response to a HIGH signal from the comparator 316 but also in response to a HIGH signal from RESET_1. In some embodiments, the microcontroller 116 applies a HIGH signal to RESET_1 after the voltage characterizing a positive transient has been read from node 320. In some embodiments, a signal applied to RESET_1 may be used to perform a reset operation 212 as described above.

In some embodiments, a second reset control node 330 (RESET_2) is provided. The second comparator 318 and the second reset control node 330 are coupled to the second switch 312 through a second OR gate 332. In this way, the second switch 312 is closed not only in response to a HIGH signal from the comparator 318 but also in response to a HIGH signal from RESET_2. In some embodiments, the microcontroller 116 applies a HIGH signal to RESET_2 after the voltage characterizing a negative transient has been read from node 320. In some embodiments, a signal applied to RESET_2 may be used to perform a reset operation 212 as described above.

In some embodiments, a filter 334 (e.g. a frequency-specific filter such as a band-pass filter) may be provided between the capacitor terminal 303 and the comparators 316 and/or 318. In such embodiments, the comparators 316 and 318 may be most sensitive to detecting transients that correspond to the frequency characteristics defined by the filter 334. In other embodiments, however, no filter is provided between the capacitor terminal 303 and the comparators 316 and/or 318.

In some embodiments, a resistive path is provided between capacitor terminal 303 and ground (or to another predetermined voltage level) to allows for a slow discharge of the capacitor regardless of the open or closed state of the first and second unidirectional current paths.

While FIG. 3 shows an embodiment in which switches 308 and 312 are closed by a HIGH (or "1") signal and opened by a LOW (or "0") signal, and in which the comparator circuitry uses a LOW signal to indicate a voltage excursion outside the range of ($V_{ThL}$, $V_{ThU}$), it should be understood that other types of signaling may be used, for example with one or more switches being closed by a LOW parameter and the output of one or more of the comparators and other logical components (such as OR gates 331, 332) being adjusted accordingly. An example of one such embodiment is illustrated in FIG. 4.

Figure 4:
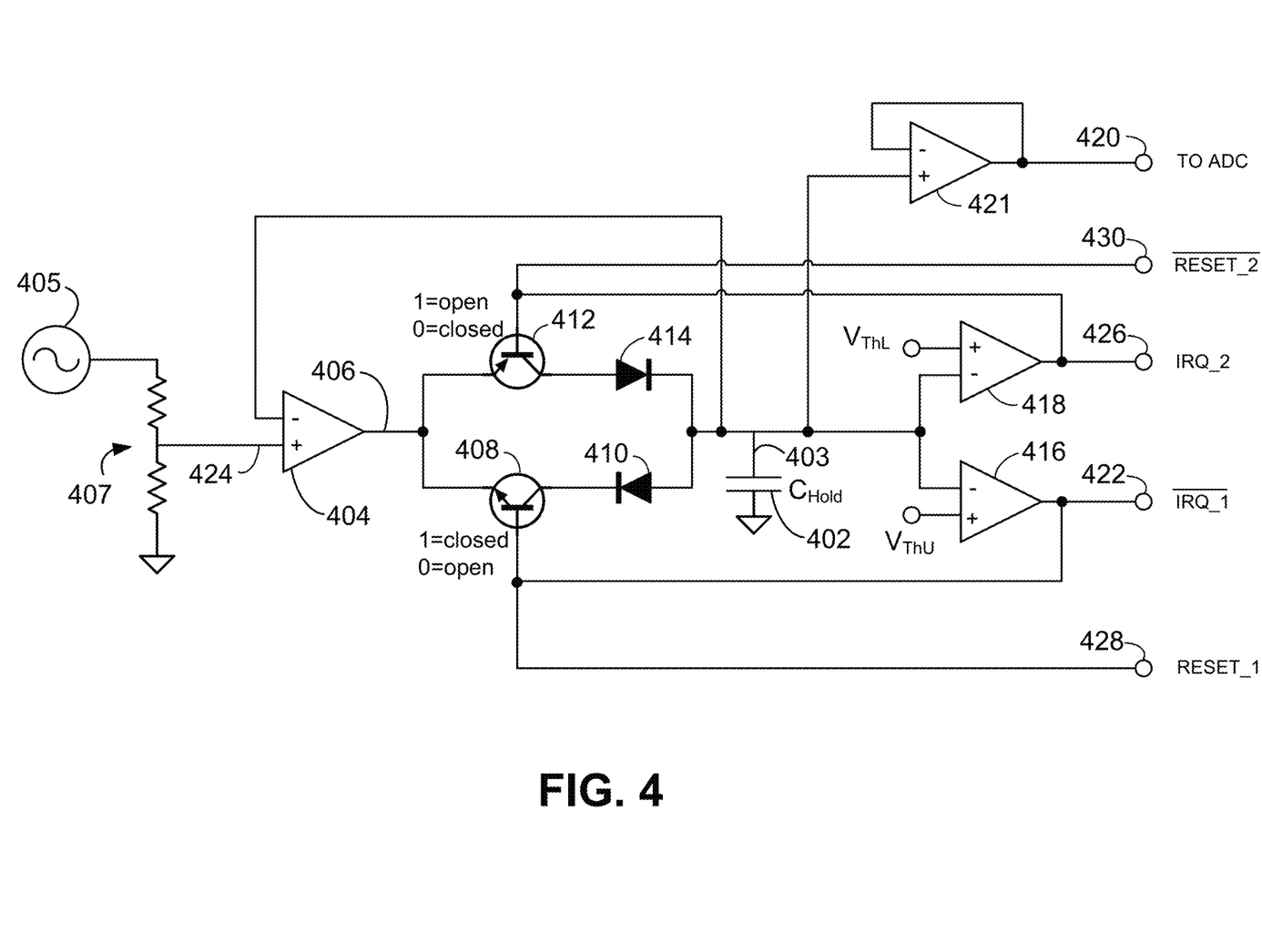
FIG. 4 is a schematic circuit diagram of an apparatus according to additional embodiments.

FIG. 4 illustrates a circuit according to some embodiments in which the switches in the switchable unidirectional current paths are implemented using transistors.

The circuit of FIG. 4 includes a capacitor 402, which may be a hold capacitor with capacitance $C_{Hold}$. The capacitor includes a first capacitor terminal 403. A second terminal of the capacitor may be coupled (directly or indirectly) to ground or to another predetermined voltage level.

A buffer amplifier 404 is provided. In some embodiments, the buffer has an open-loop DC gain of at least 60 dB. In some embodiments, the buffer has a gain-bandwidth product of at least 8 MHz. In other embodiments, however, the buffer amplifier may have other gain values. The buffer amplifier has an output node 406.

In some embodiments, an input node 424 of the buffer amplifier 404 is releasably coupled (e.g. through a two- or three-prong connector or other power plug) to a household AC power supply 405. A voltage divider 407 is also provided between the AC power supply 405 and the buffer amplifier 404 to scale down the power supply voltage to a more manageable level for signal processing. In some embodiments, a direct current (DC) offset is also applied to the input voltage so that the signal at input node 424 is positive even when the power supply voltage is negative.

The circuit includes a first current path between the output node 406 and the capacitor terminal 403. The first current path includes, in series, a first transistor 408 and a first diode 410. The first diode is oriented to prevent current flow from the output node to the capacitor terminal. In the circuit of FIG. 4, the first transistor 408 is an NPN bipolar junction transistor.

The circuit further includes a second current path between the output node 406 and the capacitor terminal 403. The second current path has, in series, a second transistor 412 and a second diode 414, the second diode being oriented to prevent current flow from the capacitor terminal to the output. In the circuit of FIG. 4, the second transistor 412 is a PNP bipolar junction transistor.

In some embodiments, the bipolar junction transistors 408, 412 are selected to have a very low storage time, as a lower storage time may improve the maximum surge holding accuracy.

In some embodiments, N and P channel MOSFETs are used in the circuit in place of the NPN and PNP bipolar junction transistors described above. In such embodiments, the buffer circuit may be configured to meet the $V_{gs}$ turn-on threshold requirements of the MOSFETs.

Because the voltage of the AC power source 405 may be quite high, with the voltage of any superimposed transients potentially being even higher, the downscaling of the input voltage for processing (e.g. by the voltage divider 407) may be sufficiently great to result in a relatively low voltage difference between capacitor terminal 403 and buffer output node 406 during normal operation. In some embodiments, to allow for a sufficient voltage difference between terminal 403 and node 406 to permit operation of the transistors 408, 412, the diodes 410, 414 may be Schottky diodes, which generate less of a voltage drop than PN junction diodes.

Comparator circuity is provided including a first comparator 416 and a second comparator 418. One or more of the comparators may be implemented using an operational amplifier (op amp). The first comparator 416 is configured to bias transistor 408 into cut-off mode in response to a determination that a voltage on the capacitor terminal 403 is above an upper threshold $V_{ThU}$. The second comparator 418 is configured to bias transistor 412 into cut-off mode in response to a determination that a voltage on the capacitor terminal 403 is below a lower threshold $V_{ThL}$.

In some embodiments, the comparator the upper threshold voltage $V_{ThU}$ and the lower threshold voltage $V_{ThL}$ are provided to their respective comparators as reference voltages, which may be generated using, for example, voltage dividers or other techniques.

In the example of FIG. 4, while the voltage on the capacitor terminal 403 is below the upper threshold voltage $V_{ThU}$, the comparator 416 outputs a HIGH (or "1") value that drives the first transistor 408 into saturation mode, corresponding to a closed switch state. If the voltage on the capacitor terminal 403 goes above the upper threshold voltage $V_{ThU}$, the comparator 416 outputs a LOW (or "0") value that drives the first transistor 408 into cut-off mode (except under reset conditions, discussed below), corresponding to an open switch state.

Conversely, while the voltage on the capacitor terminal 403 is above the lower threshold voltage $V_{ThL}$, the comparator 418 outputs a LOW (or "0") value that drives the second transistor 412 into saturation mode, corresponding to a closed switch state. If the voltage on the capacitor terminal 403 goes below the lower threshold voltage $V_{ThL}$, the comparator 418 outputs a HIGH (or "1") value that drives the second transistor 412 into cut-off mode (except under reset conditions, discussed below), corresponding to an open switch state.

A node 420 is provided through which the circuit may be coupled (directly or indirectly to an analog to digital converter, such as ADC 114. In some embodiments, the coupling between node 420 and the ADC is accomplished through either or both of a buffer amplifier (such as op amp 421) and a filter (such as a low-pass filter).

In some embodiments, a node 422 is provided to signal an output (e.g. $\overline{IRQ\_1}$) that may be used to represent the output of the first comparator 416. The output provided at node 422 may be used in some embodiments (e.g. by the microcontroller 116) to trigger the reading by an ADC (e.g. ADC 114) of the voltage at node 420 in response to the voltage exceeding the threshold $V_{ThU}$. The voltage read at node 420 represents a possibly filtered, scaled, offset, and/or buffered version of the voltage on the capacitor terminal 403. In this way, the voltage read at the node 420 may be used characterize a positive transient voltage at the AC power supply 405 without requiring specialized high-speed, high-voltage, or high-frequency circuitry.

In some embodiments, a node 426 is provided to signal an output (e.g. IRQ_2) that may be used to represent the output of the second comparator 418. The output provided at node 426 may be used in some embodiments (e.g. by the microcontroller 116) to trigger the reading by an ADC (e.g. ADC 114) of the voltage at node 420 in response to the voltage falling below the threshold $V_{ThL}$. In this way, the voltage read at the node 420 may be used characterize a negative transient voltage at the AC power supply 405 without requiring specialized high-speed, high-voltage, or high-frequency circuitry. A circuit as shown in FIG. 4 thus allows for measurement and characterization of both positive and negative transients in the AC power supply voltage.

Some embodiments are configured as shown in FIG. 4 to detect and allow measurement of both positive and negative transient voltages. Other embodiments may be configured to detect and allow measurement only of positive transients or only of negative transients.

In some embodiments, a first reset control node 428 (RESET_1) is provided. The first reset control node 428 is coupled to the base of the first transistor 408. In this way, the first transistor 408 is driven into saturation mode (corresponding to a closed state) not only in response to a HIGH signal from the comparator 416 but also in response to a HIGH signal from RESET_1. In some embodiments, the microcontroller 116 applies a HIGH signal to RESET_1 after the voltage characterizing a positive transient has been read from node 420. In some embodiments, a signal applied to RESET_1 may be used to perform a reset operation 212 as described above.

In some embodiments, a second reset control node 430 ($\overline{RESET\_2}$) is provided. The second reset control node 430 is coupled to the base of the second transistor 412. In this way, the second transistor 412 is driven into saturation mode (corresponding to a closed state) not only in response to a LOW signal from the comparator 418 but also in response to a LOW signal from $\overline{RESET\_2}$. In some embodiments, the microcontroller 116 applies a LOW signal to $\overline{RESET\_2}$ after the voltage characterizing a negative transient has been read from node 420. In some embodiments, a signal applied to $\overline{RESET\_2}$ may be used to perform a reset operation 212 as described above.

A circuit as shown in FIG. 1, 3, or 4 may be described as a conditional track and hold amplifier (CTHA). Such circuits may be used as a component of an analog-to-digital signal processing chain. The signal voltages may be scaled, level-shifted, and/or buffered appropriately to meet the goals of a given deployment. In some embodiments, additional circuitry may be provided to stabilize the op amp and comparators, depending on the component selection. While other implementations may be used, the implementation of FIGS. 3 and 4 uses one buffer op amp, two comparators, two switches, two diodes, one capacitor, and two optional OR gates.

In an example CTHA, the op amp (e.g. 102, 304, 404) tracks the incoming signal as long as its amplitude is less than $V_{ThU}$ and greater than $V_{ThL}$. When the signal amplitude is within this range, both switches are closed allowing both diodes to conduct in their respective direction and the voltage on $C_{Hold}$ tracks the voltage of the incoming signal.

If the signal amplitude goes above $V_{THU}$, the first switch (e.g. 308 or 408) opens, preventing the voltage on $C_{Hold}$ from being pulled in the negative direction, therefore holding the positive peak. Likewise, if the signal amplitude goes below $V_{ThL}$, the second switch (e.g. 312 or 412) opens, preventing the voltage on $C_{Hold}$ from being pushed in the positive direction, therefore holding the negative peak.

The outputs (e.g. 322, 326, 422, 426) of the comparators (e.g. 316, 318, 416, 418) may be provide to an input GPIO (general-purpose input/output) of a microcontroller (MCU) and can be used as indicators that a peak has been captured. Similarly, GPIO outputs from the MCU connected to the switches, e.g. through OR gates, may be used to temporarily force the switches closed to re-center the voltage on $C_{Hold}$. This may be done after a peak has been recognized by the data acquisition system.

Figure 5:
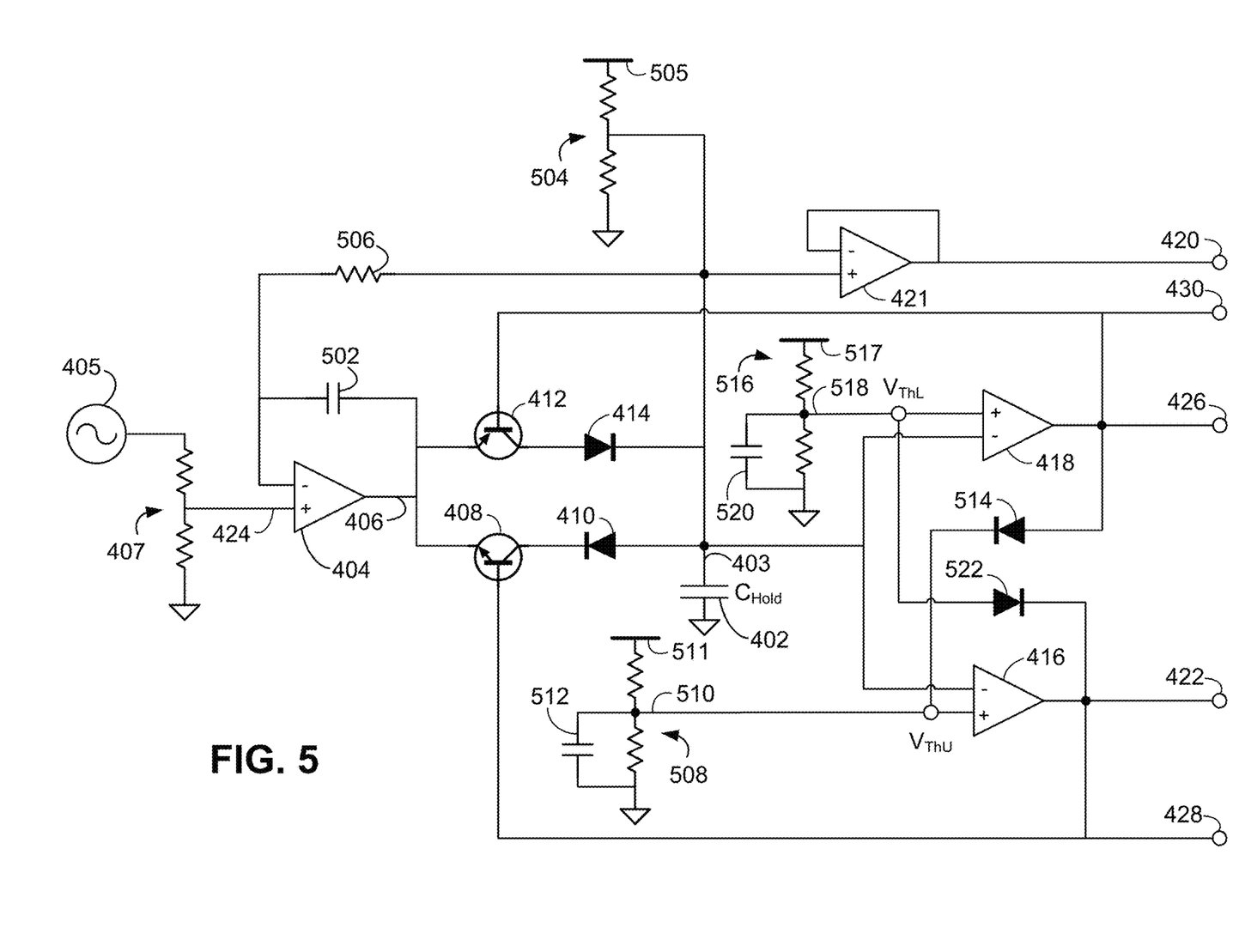
FIG. 5 is a schematic diagram of the circuit of FIG. 4 with additional stability-enhancing circuitry that is implemented in some embodiments.

FIG. 5 is a schematic diagram of the circuit of FIG. 4 with additional features one or more of which may be used in some embodiments to enhance the stability of the circuit.

As the circuit of FIG. 4 includes two high gain stages in series, namely the buffer amplifier 404 and the comparators 416, 418, it is susceptible to oscillation. Buffer amplifier 404 may be susceptible to oscillation at high frequencies. In some embodiments, a capacitor 502 is be provided to limit high-frequency gain and prevent high-frequency oscillation. However, the capacitor 502 may not be needed in all embodiments.

In some embodiments, additional componentry is provided to reduce or eliminate the possibility of low-frequency oscillations.

In some embodiments, a high impedance bias network 504 coupled to a voltage source 505 is provided to pull the voltage of the hold capacitor 402 back toward the tracking range (e.g. between $V_{ThL}$ and $V_{ThU}$) regardless of the operation of the transistors 408 and 412. The connection between the hold capacitor 402 and the bias network 504 may be an unswitched coupling that allows at least some current flow regardless of the states of transistors 408, 412, so long as there is a voltage difference between the hold capacitor and the output of the bias network.

In normal operation, a (positive or negative) peak is held by opening up the feedback loop at transistor 408 or 412 by turning one of these transistors off, putting the circuit in "hold" mode, and capturing the peak voltage on capacitor 402. When the surge goes away, the buffer amplifier 404 is working to generate an output to match the incoming signal at node 424. As the amplitude of the regular signal is less than the peak, the buffer amplifier 404 is operating to pull the voltage of the hold capacitor 402 back into the tracking range. But the transistor that would allow the hold capacitor voltage to pulled into the tracking range was turned off by the last peak. As a result, there is a risk of the buffer amplifier 404 swinging all the way in the opposite direction, but it is prevented from doing so until transistor(s) 408 and/or 412 are reset by injecting current into their bases, or until the high-impedance bias network 504 slowly pulls capacitor 402 back into the tracking range ("track" mode). However, with buffer amplifier 404 providing its maximum output at a voltage opposite of the last peak, when the feedback loop is closed again, the hold capacitor 402 is quickly charged up to a new peak of the opposite polarity. There is a risk of that peak being mistakenly detected as a transient by the opposite comparator, and the loop is opened up again, placing the circuit back into "hold" mode, but with a peak of the opposite polarity. In this event, there is a risk of a low-frequency oscillation in which the circuit alternates between "detecting" peaks of opposite polarity each time it is reset.

To address this type of potential low-frequency oscillation, some embodiments operate to shift the threshold voltages provided to the comparator. For example, in response to a voltage on the capacitor 402 exceeding the upper threshold, the lower threshold voltage may temporarily be lowered. Conversely, in response to a voltage on the capacitor 402 dropping below the lower threshold, the upper threshold voltage may temporarily be raised. This reduces or eliminates the likelihood that a reset operation, performed after detection of one peak, spuriously triggers detection of an opposite peak.

In some embodiments the changes to the threshold voltages are performed using circuitry as shown in FIG. 5. The upper threshold $V_{ThU}$ is provided through upper threshold voltage supply circuitry 508 that includes a voltage divider having an output node 510 with a capacitive path 512 to ground. The voltage supply circuitry 508 is coupled to a voltage source 511. The output node 510 is coupled through a diode 514 to the output of the second comparator 418. In "track" mode, the output of comparator 418 is low, and the coupling through diode 514 has no substantial effect on the upper threshold voltage $V_{ThU}$. However, when the voltage on capacitor 402 falls below the lower threshold $V_{ThL}$, the resulting voltage at the output of the second comparator 418, acting through diode 514, drives the upper threshold voltage $V_{ThU}$ higher. The capacitor 512 temporarily keeps the threshold voltage $V_{ThU}$ at an elevated level for a short period even after the second comparator returns to a low output voltage. This way, even if there is a voltage swing from low to high during a reset operation, the voltage swing is less likely to exceed the temporarily-elevated threshold voltage $V_{ThU}$ and thus is less likely to trigger a spurious peak detection and possible oscillation.

A similar arrangement is provided to temporarily lower the lower threshold. The lower threshold $V_{ThL}$ is provided using lower threshold voltage supply circuitry 516 that includes a voltage divider having an output node 518 with a capacitive path 520 to ground. The voltage supply circuitry 516 is coupled to a voltage source 517. The output node 518 is coupled through a diode 522 to the output of the first comparator 416. In "track" mode, the output of comparator 416 is high, and the coupling through diode 522 has no substantial effect on the lower threshold voltage $V_{ThL}$. However, when the voltage on capacitor 402 rises above the upper threshold $V_{ThH}$, the resulting low voltage at the output of the first comparator 416, acting through diode 522, pulls the lower threshold voltage $V_{ThL}$ even lower. The capacitor 520 temporarily keeps the threshold voltage $V_{ThL}$ at the lowered level for a short period even after the first comparator returns to a higher output voltage. This way, even if there is a voltage swing from high to low during a reset operation, the voltage swing is less likely to drop below the temporarily-lowered threshold voltage $V_{ThL}$ and thus is less likely to trigger a spurious peak detection and possible oscillation.

Thus, with the use of the cross-connected diodes 514 and 522 in conjunction with capacitors 512 and 520, when one comparator detects a surge, its output shifts the threshold of the other comparator to a more extreme level, keeping it from detecting the opposite peak when coming out of "hold" mode, and then returning to the regular thresholds as capacitors 512 and 520 discharge to their normal levels.

In a further feature used in some embodiments to address potential low-frequency oscillation, the "reset" signals are applied simultaneously by the microcontroller 116 during a reset operation to exit the "hold" mode. This forces the transistors 408, 412 closed, completing the "track" mode feedback loop and overpowering the comparator outputs which drive the bases of those transistors with more than twice the impedance. Once the buffer amplifier 404 is back in tracking range, both resets are then released, and the circuit will track again until one of the comparators is tripped by a new surge on the incoming signal.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Other variations of the described embodiments are contemplated. The above-described embodiments are intended to be illustrative, rather than restrictive, of the present invention. The scope of the invention is thus not limited by the examples given above but rather is defined by the following claims.

The invention claimed is:

1. An apparatus comprising:
   a buffer amplifier having an output node;
   a first switchable unidirectional current path between the output node and a capacitor, the first unidirectional current path including a diode oriented with a cathode thereof toward the output node;
   a second switchable unidirectional current path between the output node and the capacitor, the second unidirectional current path including a diode oriented with a cathode thereof toward the capacitor; and
   comparator circuitry operative, in response to a voltage on the capacitor being above an upper threshold, to open the first switchable unidirectional current path, the comparator circuitry further being operative, in response to the voltage on the capacitor being below a lower threshold, to open the second switchable unidirectional current path.

2. The apparatus of claim 1, further comprising:
   upper threshold voltage supply circuitry coupled to the comparator circuitry, the upper threshold voltage supply circuitry being configured to temporarily raise the upper threshold in response to the voltage on the capacitor being below the lower threshold; and lower threshold voltage supply circuitry coupled to the comparator circuitry, the lower threshold voltage supply circuitry being configured to temporarily lower the lower threshold in response to the voltage on the capacitor being above the upper threshold.

3. The apparatus of claim 1, further comprising an analog-to-digital converter configured to sample the voltage on the capacitor.

4. The apparatus of claim 1, further comprising a filter between the capacitor and the comparator circuitry.

5. The apparatus of claim 1, further comprising an alternating current (AC) power plug coupled to an input node of the buffer amplifier.

6. An apparatus comprising:
a capacitor having a capacitor terminal;
a buffer amplifier having an output node;
a first current path between the output node and the capacitor terminal, the first current path having, in series, a first switch and a first diode, the first diode being oriented with a cathode thereof toward the output node;
a second current path between the output node and the capacitor terminal, the second current path having, in series, a second switch and a second diode, the second diode being oriented with a cathode thereof toward the capacitor terminal; and
a first comparator configured to open the first switch in response to a determination that a voltage on the capacitor terminal is above an upper threshold.

7. The apparatus of claim 6, further comprising:
a second comparator configured to open the second switch in response to a determination that a voltage on the capacitor terminal is below a lower threshold.

8. The apparatus of claim 7, wherein:
the upper threshold is determined by an output voltage of a first voltage divider, the first voltage divider having an output that is capacitively coupled to ground and that is coupled to an output of the first comparator through a diode; and
the lower threshold is determined by an output voltage of a second voltage divider, the second voltage divider having an output that is capacitively coupled to ground and that is coupled to an output of the second comparator through a diode.

9. The apparatus of claim 6, further comprising an analog-to-digital converter coupled to the capacitor terminal.

10. The apparatus of claim 6, wherein the first switch comprises a first transistor and the second switch comprises a second transistor.

11. The apparatus of claim 6, wherein the first switch comprises an NPN transistor and the second switch comprises a PNP transistor.

12. The apparatus of claim 6, wherein the capacitor terminal has an unswitched coupling to an output of a bias network.

13. The apparatus of claim 6, further comprising an alternating current (AC) power plug coupled to an input node of the buffer amplifier.

14. A method comprising:
providing a signal to a capacitor;
comparing a voltage on the capacitor to a predetermined upper threshold voltage;
in response to a determination that the voltage on the capacitor is greater than the upper threshold voltage, at least temporarily preventing the signal from discharging the capacitor;
reading at least a first voltage from the capacitor; and
after reading the first voltage, while the voltage on the capacitor is greater than the upper threshold voltage, resetting the capacitor voltage by closing a first current path between the signal and the capacitor.

15. The method of claim 14, further comprising:
comparing the voltage on the capacitor to a predetermined lower threshold voltage;
in response to a determination that the voltage on the capacitor is less than the lower threshold voltage, at least temporarily preventing the signal from charging the capacitor;
reading at least a second voltage from the capacitor; and
after reading the second voltage, while the voltage on the capacitor is less than the lower threshold voltage, resetting the capacitor voltage by closing a second current path between the signal and the capacitor.

16. The method of claim 14, wherein reading the first voltage is performed in response to the determination that the voltage on the capacitor is greater than the upper threshold voltage.

17. The method of claim 15, wherein reading the second voltage is performed in response to the determination that the voltage on the capacitor is less than the lower threshold voltage.

18. The method of claim 14, wherein the signal represents a voltage of an alternating current (AC) power supply.

19. The method of claim 14, further comprising:
in response to a determination that the voltage on the capacitor is less than a lower threshold voltage, temporarily raising the upper threshold voltage; and
in response to a determination that the voltage on the capacitor is greater than the upper threshold voltage, temporarily lowering the lower threshold voltage.

* * * * *